(12) United States Patent
Blanco-Garcia et al.

(10) Patent No.: US 9,196,446 B2
(45) Date of Patent: Nov. 24, 2015

(54) HYDROGEN GETTER

(75) Inventors: Patricia Blanco-Garcia, Oxford (GB); Paul J Collier, Reading (GB); John West, Darlington (GB); Alison M Wagland, Watlington (GB)

(73) Assignee: JOHNSON MATTHEY PLC, London (GB)

( * ) Notice: Subject to any disclaimer, the term of this patent is extended or adjusted under 35 U.S.C. 154(b) by 865 days.

(21) Appl. No.: 11/793,027

(22) PCT Filed: Dec. 14, 2005

(86) PCT No.: PCT/GB2005/050247
§ 371 (c)(1),
(2), (4) Date: Mar. 18, 2008

(87) PCT Pub. No.: WO2006/064289
PCT Pub. Date: Jun. 22, 2006

(65) Prior Publication Data
US 2008/0272333 A1 Nov. 6, 2008

(30) Foreign Application Priority Data
Dec. 17, 2004 (GB) .................................. 0427647.3

(51) Int. Cl.
*H01J 7/18* (2006.01)
*B01J 20/06* (2006.01)
*B01J 20/18* (2006.01)
*B01J 20/16* (2006.01)
*B01J 20/28* (2006.01)
*C01B 3/00* (2006.01)
*H01L 23/26* (2006.01)

(52) U.S. Cl.
CPC ................. *H01J 7/183* (2013.01); *B01J 20/06* (2013.01); *B01J 20/165* (2013.01); *B01J 20/18* (2013.01); *B01J 20/2803* (2013.01); *C01B 3/001* (2013.01); *H01L 23/26* (2013.01); *B01J 2220/42* (2013.01); *H01L 2924/0002* (2013.01); *Y02E 60/324* (2013.01)

(58) Field of Classification Search
USPC ........ 428/34.1, 34.4, 248, 606, 607, 69, 34.6; 252/181.1, 181.6, 194, 181.5; 95/55, 95/56; 220/422, 901, 421, 429
See application file for complete search history.

(56) References Cited

U.S. PATENT DOCUMENTS

| | | | |
|---|---|---|---|
| 3,108,706 A | 10/1963 | Matsch et al. | |
| 4,405,487 A | 9/1983 | Harrah et al. | |
| 4,559,471 A | 12/1985 | Kroontje | |
| 5,158,582 A * | 10/1992 | Onitsuka et al. | 95/129 |
| 5,244,707 A | 9/1993 | Shores | |
| 5,304,419 A | 4/1994 | Shores | |
| 5,365,742 A | 11/1994 | Boffito et al. | |
| 5,624,598 A | 4/1997 | Shepodd et al. | |
| 5,888,925 A | 3/1999 | Smith et al. | |
| 6,068,824 A * | 5/2000 | Kinoshita et al. | 423/239.1 |
| 6,200,494 B1 | 3/2001 | Manini et al. | |
| 6,369,442 B1 | 4/2002 | Saito | |
| 6,428,612 B1 | 8/2002 | McPhilmy et al. | |
| 6,548,889 B2 | 4/2003 | Saito | |
| 6,682,817 B1 | 1/2004 | Della Porta | |
| 2002/0009404 A1 * | 1/2002 | Tsybulevskiy et al. | 423/244.04 |
| 2002/0052291 A1 * | 5/2002 | Siriwardane | 502/244 |
| 2002/0140138 A1 * | 10/2002 | Wu et al. | 264/630 |
| 2003/0062610 A1 | 4/2003 | Kovacs et al. | |
| 2004/0036168 A1 * | 2/2004 | Bedinger et al. | 257/728 |
| 2004/0072687 A1 * | 4/2004 | Sekiba et al. | 502/325 |
| 2004/0229101 A1 * | 11/2004 | Davis | 429/34 |

FOREIGN PATENT DOCUMENTS

| | | |
|---|---|---|
| GB | 1339524 | 12/1973 |
| WO | 94/18876 | 9/1994 |
| WO | WO 2004/035178 | 4/2004 |

OTHER PUBLICATIONS

International Search Report dated Mar. 29, 2006 for PCT/GB2005/050247.
Third Party Observation Under Article 115 EPC dated Mar. 21, 2011 in EP 05818485.4 (corresponding European application).
Belousov et al., "Low-Temperature Hydrogen Reduction of Pure $Co_2O_4$ and Doped with Palladium", Applied Surface Science, vol. 35, (1988-89), pp. 481-494.

* cited by examiner

*Primary Examiner* — Tanisha Diggs
(74) *Attorney, Agent, or Firm* — Jones Day

(57) ABSTRACT

A getter composition suitable for gettering hydrogen comprises a first metal oxide and a second metal oxide, said first metal oxide being more readily reducible in hydrogen at temperatures between 0° C. and 100° C. than said second metal oxide.

33 Claims, 2 Drawing Sheets

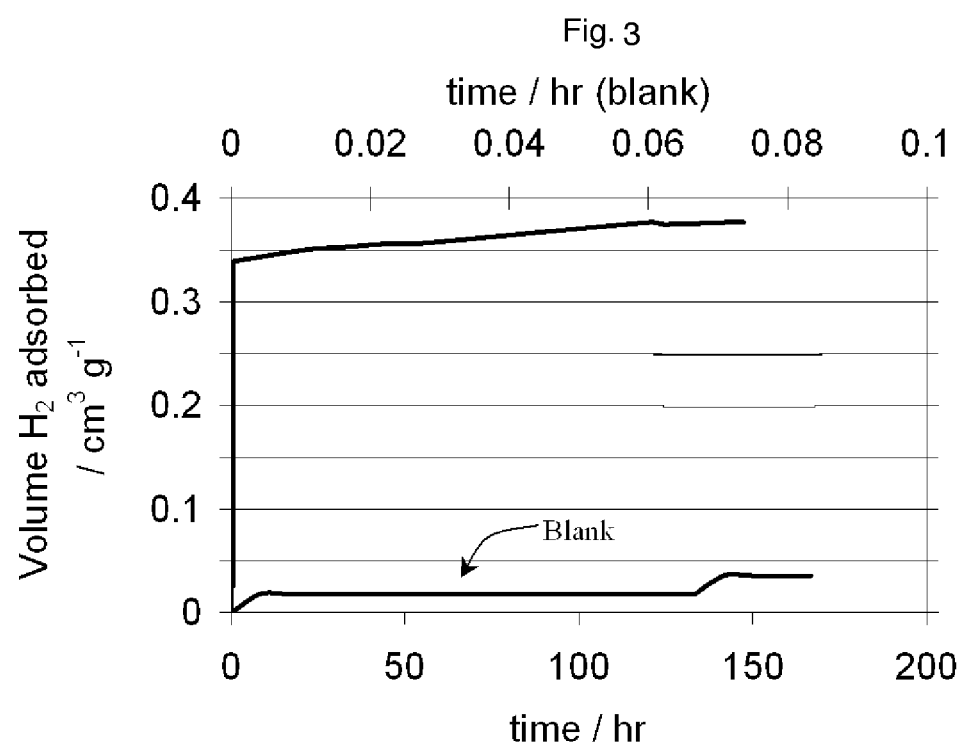

HYDROGEN GETTER

CROSS REFERENCE TO RELATED APPLICATION

This application is the National Phase application of International Application No. PCT/GB2005/050247, filed Dec. 14, 2005, which designates the United States and was published in English. This application, in its entirety, is incorporated herein by reference.

TECHNICAL FIELD

The present invention relates to a getter composition especially a composition which is capable of absorbing hydrogen.

BACKGROUND ART

Getters are absorbent compositions often used within a sealed enclosure forming part of, or a housing for, the electrical or electronic device, to remove unwanted materials from the atmosphere within the enclosure. Getter compositions for the removal of hydrogen are already known. For example, unsaturated organic compounds may be used as hydrogen getters, optionally in a composition including a hydrogenation catalyst. In U.S. Pat. No. 6,428,612 B—, a hydrogen getter is described comprising a particulate zeolite having a portion of its sodium ions exchanged by an activated metal such as silver. The getter is provided in a flexible hydrogen permeable, moisture-impermeable sheet material in combination with a moisture absorber. U.S. Pat. No. 4,559,471 A—. describes the use of getter auxiliary means for decomposition of hydrocarbons within evacuated apparatus in which the getter auxiliary means comprises an inorganic porous carrier charged with one or more of rhodium, copper, platinum, palladium and their oxides. U.S. Pat. No. 6,200,494 B—. describes a combination of getter materials comprising a mixture of an oxide of a transition metal, metallic palladium and a moisture absorbing material.

DISCLOSURE OF INVENTION

It is an object of the present invention to provide a getter which is capable of absorbing, and has a high capacity for, hydrogen.

According to the invention we provide a composition suitable for use as a getter for hydrogen comprising a first metal oxide and a second metal oxide, said first metal oxide being more readily reducible in hydrogen at temperatures between 0° C. and 100° C. than said second metal oxide.

The first metal oxide is preferably selected from an oxide of platinum, palladium, rhodium and ruthenium and is most preferably palladium oxide, PdO. The second metal oxide is preferably an oxide of a transition metal, more preferably selected from copper oxide, iron oxide, nickel oxide, cobalt oxide, cerium oxide and silver oxide. The most preferred second metal oxides are copper (II) oxide and iron oxide especially as $Fe_3O_4$.

The getter composition may optionally comprise a moisture absorbing material as a further component. The moisture absorbing material is preferably a zeolite. Particularly suitable zeolites include FAU zeolites such as that sold as CBV500™ by Zeolyst International, or LTA zeolite (A-type). In a preferred embodiment the moisture absorbing material is a mixture of more than one zeolite especially a mixture of a small-pore zeolite such as an LTA zeolite which absorbs water rapidly, with a larger-pore zeolite such as a FAU zeolite which has a very high moisture absorbing capacity. An alternative moisture absorbing material may be used, e.g. an anhydrous metal oxide such as barium oxide. However, such materials are more difficult to dry when they have absorbed moisture and therefore they are not preferred moisture absorbents. When one of the first and second metal oxide is components is capable of absorbing water, the presence of an additional moisture absorbing component may be unnecessary. For example, when the second metal oxide comprises copper oxide in the form of a calcined malachite, a separate moisture absorber may not be required.

The getter may be provided in the form of a shaped pellet or tablet which is non-friable and resistant to breakage. In this form, the getter dimensions may vary according to the application for which it is to be used, but typically the largest dimension is between about 2 mm and 30 mm. The shape of the getter may be a circular, rectangular, triangular or other polygonal tablet, having a thickness of between about 0.5 and 5 mm. Other shapes designed to provide a relatively large surface for exposure to the atmosphere may also be used.

A binder compound may be present in the getter to provide a strong tablet or extrudate. The binder is any suitable inorganic binder material. Preferred binders are non-porous silicas such as colloidal silica or fumed silica. The composition preferably contains up to 25% by weight of the binder. Other compounds such as lubricants, colourants etc may also be present. Pelleting aids such a graphite or metal stearates may be included in the powder mixture, but since at the preferred calcination temperatures graphite may only be partially removed, stearates, especially magnesium stearate, are preferred pelleting aids.

To assist with the extrusion or granulation process, or indeed to assist in the preparation of a paste which is subsequently dried and milled before tabletting, certain organic components may be added. These organic components can be readily removed during any calcination stage (as described above) leaving no residual organic species. For the tabletting process convenient organic additives include polyvinyl alcohol or cellulose materials such as microcrystalline cellulose.

Tabletting (or compaction) is the preferred method of preparing the final form of a getter according to the invention in the form of a shaped pellet or tablet. This is because it provides a higher density formed body than other methods of forming such as extrusion or granulation and can give products having a close dimensional tolerance. The higher density allows a higher mass loading of getter into a housing of a certain volume or alternatively allows the same mass of getter to be enclosed in a smaller volume: this is an important consideration for electronic and opto-electronic devices where overall physical dimensions are an important feature. The close dimensional tolerance allows preparation of getters which may fit tightly into a certain housing or retaining unit and, most importantly, allows very thin getters (for example about 1 mm thickness) to be prepared. Alternatively the getter may be made by other shaping techniques such as roll compacting or paste extrusion followed as necessary by calcination to remove any extrusion aids etc.

Alternatively the getter may be provided in a mouldable or printable form. In this embodiment, it is preferred to mix the getter composition with a binder, e.g. an organic binder such as those which are already known for similar use. Suitable binders include cellulose derivatives, e.g. alkyl celluloses, nitrocellulose etc of the type used in printing ink formulations for example. Alternatively a polymeric binder such as a silicone polymer may be used. In this form the getter may be applied as a layer or coating to a component which forms a part of the device in which the getter is to be used. When the getter is provided in this form, the binder material must be permeable to the gas which is intended to be absorbed by the getter. In this form of the invention the getter composition which is suitable for application to a substrate as an ink or coating, preferably additionally comprises a solvent for said binder in which at least a part of the binder material is soluble. The selection of a suitable solvent depends upon the binder selected and may be done by the skilled person with routine experimentation.

The first metal oxide may be applied by precipitation onto the second metal oxide, may be coprecipitated with the second metal oxide or may be applied to the second metal oxide by impregnation of the second metal oxide with a solution of a precursor of the first metal oxide. Suitable soluble salts of the first or second metals include nitrates, sulphates, halides, carboxylates etc. Normally aqueous solutions are used in the preparation of the first and/or second metal oxide. In a typical precipitation method, an aqueous solution of a soluble salt of the first metal is mixed with an alkaline precipitating agent such as an alkali metal carbonate, hydroxide or bicarbonate to effect precipitation of an insoluble salt of the first metal. The precipitation may be effected in the presence of particles of the second metal oxide. The precipitated first metal compound is then heated to form the first metal oxide.

Co-precipitation methods are equally well-known in the art. A mixed solution of a soluble precursor of each of the first and second metal oxides may be pre-mixed before the addition to the mixture of a precipitant. Alternatively a solution of a precursor to one of the first or second metal oxides may be added to the precipitant separately from the solution of the precursor to the other metal oxide either prior to or simultaneously with that other metal compound precipitation in order to maintain control over the pH of the solution during precipitation. All of these methods are well known. The co-precipitated metal compounds are then heated to form the metal oxides.

In a further method, the metal oxide may be applied by impregnating a solid form of the second metal oxide with a soluble compound of the first metal, such as a metal salt, e.g. a nitrate, sulphate, chloride or a salt of an organic acid such as formic or acetic acid, followed by drying. Impregnation methods are well known to the skilled person. In one common method the solid material is immersed in an excess of the solution for a period of time to enable the solution to be absorbed into the pores of the solid material, before being removed and then dried. Another common impregnation technique is the so-called "incipient wetness" technique in which a measured amount of a solution of a soluble metal compound is added slowly, e.g. by spraying, to the solid material. The volume of solution applied is normally calculated to fill a certain proportion of the pore-volume of the solid material. The impregnated metal compound is then heated to form the oxide.

In a preferred form of the invention, the first metal oxide is supported on the second metal oxide in such a way that the use of a separate support is unnecessary. For example, in a preferred form of the invention, palladium oxide is supported on a solid copper oxide support. Thus the first and second metal oxides may be prepared for use in the getter composition by impregnating a solid form of the second metal oxide with a solution of the first metal oxide or a precursor thereto (for example a metal chloride or nitrate), then drying and calcining the resulting composition to transform the soluble precursor into a metal oxide. Likewise the first and second metal oxides may be co-precipitated from solution or from a solution of a precursor to the metal oxide or one of the first or second metal oxide may be precipitated from a solution of a soluble precursor to the metal oxide in the presence of the other oxide in solid form, e.g. as solid particles.

In each case when the preparation is carried out using a soluble or insoluble precursor to the metal oxide, the precipitated or impregnated metal compound is then transformed to the oxide, usually by heating in an oxygen-containing atmosphere, i.e. by calcination. Suitably the calcination is carried out by heating the oxide precursor in an oxygen-containing atmosphere (usually air) at a temperature which is normally in the range from 175 to 500° C. The calcination temperature must be selected to be suitable for the particular metal oxides used, for example when PtO is the desired product, it should not be heated to a temperature at which it may decompose to Pt metal and so a calcination temperature below about 400° C. is preferred in that case. When copper carbonate (malachite) is used as a second metal oxide precursor, then the calcination temperature should be between about 200° C. and 800° C., more preferably between about 250-350° C. to ensure complete calcination and avoid the formation of $Cu_2O$. When iron carbonate is used as a precursor to iron oxide as the second metal oxide, the calcination temperature is optimally between about 300 and 550° C., since at lower temperatures the calcination may be incomplete and at higher temperatures there is a tendency for larger crystallites to form. These preparation methods are well known from the field of catalyst preparation.

Alternatively the first or second metal oxides may be provided upon a separate support such as a porous silica or alumina, silica-alumina or other known support material. However, in order to increase the effective mass of active gettering material, and therefore provide getters which are as small as possible, it is preferred that a separate metal oxide or carbon support is not provided. In a preferred form of the invention the getter consists essentially of a first metal oxide and a second metal oxide, said first metal oxide being more readily reducible in hydrogen at temperatures between 0° C. and 100° C. than said second metal oxide, from 0-25% of a binder, and optionally materials selected from a moisture absorbing material, a colourant and a lubricant.

As a further alternative, the first and second metal oxides may be deposited on a moisture absorbing material such as a zeolite, by co-impregnation (simultaneous or sequential), co-precipitation or otherwise.

The first metal oxide is preferably present at a concentration of from 0.01% to 20%, more preferably from 0.01% to 5%, especially from about 0.1% to 2%, by weight calculated as the metal and based upon the total weight of the first and second metal oxides. The second metal oxide preferably forms from 80-99.9%, more preferably from 99.9% to 95%, by weight of the total metal oxide components of the getter composition. When a separate moisture absorbing material is provided it forms preferably from 5-75% of the total weight of the dried getter composition (including binders etc). When the getter material is in the form of a printable material, e.g. an ink or coating, so that it contains a binder and a solvent, then the amounts of first and second metal oxide and moisture absorbing material are given on the basis of the printed and dried getter material, i.e. in the absence of a solvent.

For the getter to work most effectively, the dispersion of the first metal oxide is preferably relatively high such that preferably the crystallite size of the first metal oxide is in the range 1-10 nm.

The particle size of the components of the getter material may vary considerably. The selection of a suitable particle size and shape to form a solid shaped getter is within the experience of any skilled formulator. Normally the average diameter of the primary particles will vary between 1 micron and 200 microns, and will normally be less than 100 microns. By "primary particles" we mean the particulate form of material before granulation, extrusion, tabletting etc into larger shaped units. When the getter material is in the form of a printable material, it is preferable for the solid particles to have a maximum particle size of 30 microns. The particles may be ground, milled sieved etc using known methods to select a suitable particle size and particle size distribution for the desired getter material.

Upon absorption of hydrogen the first and/or second metal oxides may be reduced to the respective metal.

EXAMPLE 1

Preparation of $PdO/Al_2O_3$ Getter

A volume of aqueous $PdNO_3$ solution which was calculated to fill the pores of a powdered gamma alumina support was added to the alumina a few drops at a time and mixed well in to make a paste. The concentration of the $PdNO_3$ solution was calculated to provide 1% by weight Pd, calculated as Pd metal, on the alumina support. This paste was dried at 110° C. before being calcined at 350° C. in air for 5 hours, during which process the $PdNO_2$ is converted to PdO. After calcination the sample was combined with CBV500 zeolite in a 1:1 weight ratio together with 1 ml of water for every gram mixed. This was again dried at 110° C. before testing for $H_2$ absorption performance.

The volume of hydrogen absorbed per gram of getter over time is shown graphically in FIG. 1. The volume uptake for the "blank", i.e. reduced sample is also shown for comparison.

Testing of the Hydrogen Uptake of the Getter

The getter prepared in Example 1 was tested by measuring its hydrogen uptake over a period of time, using standard hydrogen absorption apparatus (Micromeritics). The samples were pretreated by evacuation for at least 16 hours at 400° C., following which they were transferred to the measuring instrument without exposure to atmosphere. The sample was then evacuated in-situ for at least 4 hours. Following a leak check, the sample evacuation was continued until the leak rate is lower than 0.002 mmHg $min^{-1}$.

Initial uptake of the sample was measured by pre-dosing the instrument manifold with hydrogen and then dosing the sample with 100 ppm $H_2$ (i.e. to give a $H_2$ pressure of 0.076 mm Hg) three times in succession. The sample was then dosed with successive 10,000 ppm doses of $H_2$ until the pressure remained at greater than 10 mm Hg for 30 minutes.

A blank uptake of the reduced sample was measured by evacuating the sample after the initial uptake tests until the leak rate was less than 0.002 mmHg $min^{-1}$ and then the $H_2$ uptake was tested using the same procedure as for the initial uptake. The blank uptake tests were run in order to determine the amount of hydrogen physically absorbed into the pores of the getter material.

EXAMPLE 2

A getter material was prepared using the method described in Example 1, using malachite instead of alumina and using a solution concentration calculated to provide 0.5% by weight Pd (expressed as metal) on CuO. On calcination, the malachite loses water and $CO_2$ and forms CuO. The $PdNO_3$ is converted to PdO. The hydrogen uptake was tested by the method described and is shown graphically in FIG. 2. The testing procedure differed from that given above in that when the uptake exceeded that of the sample prepared in Example 1, much larger doses of hydrogen (100,000 ppm) were used in order to indicate the capacity of the material. The test was stopped after 40 hours even though the capacity of this sample had not been reached.

EXAMPLE 3

A getter material was prepared using the method described in Example 1, using iron carbonate instead of alumina and using a solution concentration calculated to provide only 0.05% by weight Pd (expressed as metal) on $Fe_3O_4$. On calcination, the carbonate loses water and $CO_2$ and forms iron oxide. The $PdNO_3$ is converted to PdO. The hydrogen uptake was tested by the method described and is shown graphically in FIG. 3.

EXAMPLE 4

Preparation of 0.5 wt % Pd/CuO by Co-Precipitation 6.02 g palladium nitrate solution (8.3 wt % Pd assay) was mixed with 144.67 g $Cu(NO_3)_2.6H_2O$ and made up to 200 ml with deionised water and placed in a dropping funnel. A second funnel was filled with 1M aqueous $Na_2CO_3$ solution. The mixed metal nitrates and the $Na_2CO_3$ solutions were added dropwise to a 2 litre beaker equipped with an overhead stirrer providing high agitation. The rate of addition of the two liquids was set to maintain a pH of 7.0+/−0.5 units to precipitate the mixed oxide at constant pH. When all of the metal nitrates had been precipitated the solid was recovered by filtration and washed with boiling deionised water until the conductivity of the washings dropped to less than 10 mS.

EXAMPLE 5

Preparation of 0.5 wt % Pt/CuO by Co-Precipitation

The general procedure of Example 4 was used to prepare a sample of 0.5Pt/CuO. 3.19 g of platinum nitrate (15.67 wt % Pt assay) were used with 144.67 g $Cu(NO_3)_2.6H_2O$.

EXAMPLE 6

Preparation of 0.5 wt % Rh/CuO by Co-Precipitation

The general procedure of Example 4 was used to prepare a sample of 0.5Rh/CuO. 6.97 g of rhodium nitrate (14.35 wt % Pt assay) were used with 144.67 g $Cu(NO_3)_2.6H_2O$.

EXAMPLE 7

Preparation of Getter as an Ink 9.99 g of zeolite (BDH, 3 Å pore size) and 5.73 g of Pd/CuO prepared as in Example 4 were added to 15.07 g of a 4% by weight solution of ethyl cellulose in dipropylene glycol monomethyl ether (Dowanol DPM; Aldrich). The three components were first mixed by hand and then passed through a triple roll mill, until the maximum particle size in the ink was 30 microns. The resultant ink was printed onto metal lids using a polyester screen (18 counts per cm) which, after drying, yielded a dry, dust-free deposit with a height of 145 microns.

EXAMPLE 8

Preparation of Getter as an Ink

An ink was prepared as described as in Example 4 containing 9.09 g of zeolite (BDH, 3 Å pore size), 4.20 g of 0.5%

Pd/CuO and 15.00 g of a 3% by weight solution of ethyl cellulose in 2-cyclohexylethanol (Aldrich) structured with the addition of 0.02 g of fused silica (Degussa).

BRIEF DESCRIPTION OF THE DRAWINGS

The invention will be further described in the following examples and with reference to the drawings which are:

FIGS. 1-3 graphical representations of the hydrogen uptake over time of the getters prepared in Examples 1-3.

Figure 1:
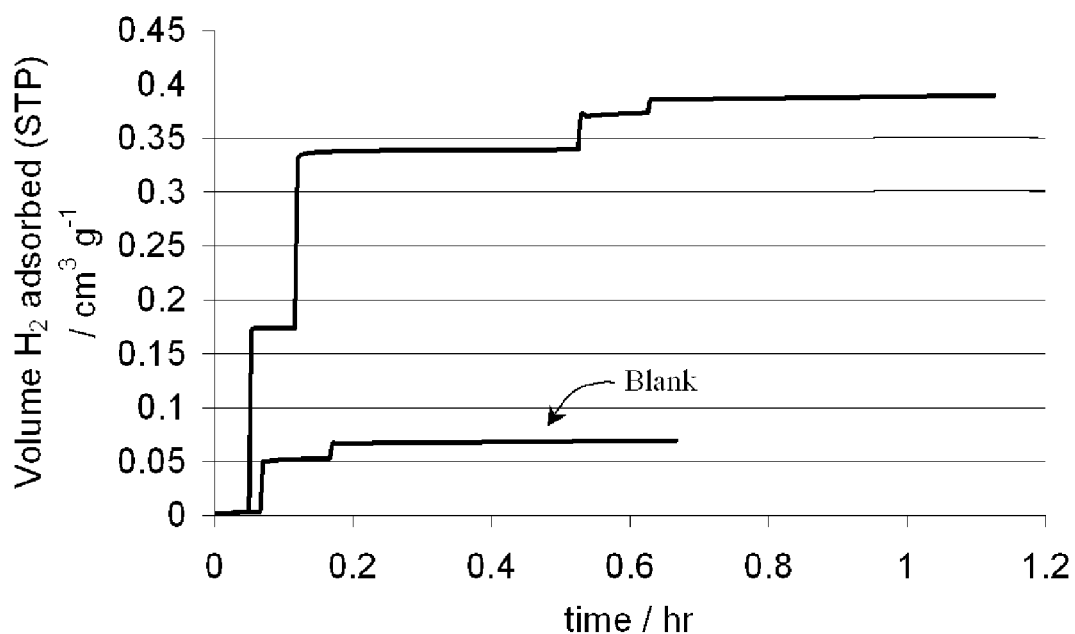
Figure 2:
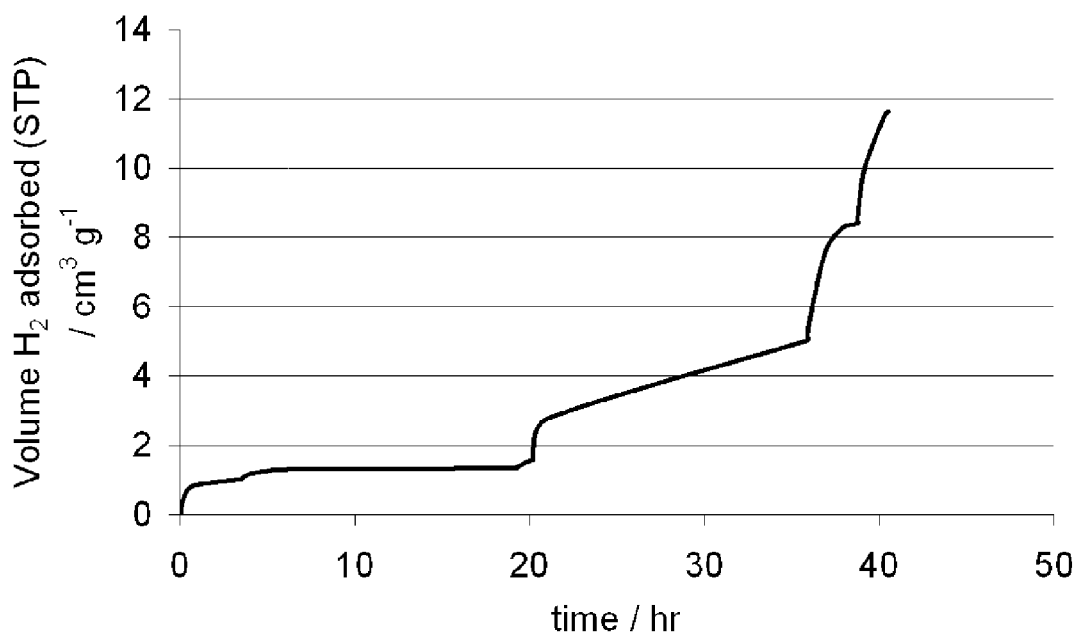

The invention claimed is:

1. A hydrogen getter composition, comprising a mixture of the following particulate components:
   i) a hydrogen-getter, comprising:
      a) a first metal oxide, comprising an oxide of a metal selected from the group consisting of platinum, palladium, rhodium, and ruthenium;
      b) 95 to 99.9 wt % of a second metal oxide, relative to the total metal oxide components of the composition, comprising an oxide of a metal selected from the group consisting of copper, iron, nickel, cobalt, and cerium; and
   ii) 5-75 wt. % of a moisture absorbing material, relative to the total weight of the composition;
wherein 0.01% to 5 wt. % of the first metal oxide is present, calculated as the metal and based upon the total weight of the first and second metal oxides.

2. The composition of claim 1, wherein the first metal oxide is precipitated onto the second metal oxide.

3. The composition of claim 1, wherein the first metal oxide is coprecipitated with the second metal oxide.

4. The composition of claim 1, wherein the first metal oxide is impregnated onto the second metal oxide.

5. The composition of claim 1, wherein the first metal oxide is supported on the second metal oxide.

6. The composition of claim 1, wherein the moisture absorbing material comprises a zeolite.

7. The composition of claim 6, wherein the zeolite is selected from the group consisting of FAU zeolites and LTA zeolites.

8. The composition of claim 1, wherein the composition is in the form of a shaped pellet or tablet.

9. The composition of claim 8, wherein the pellet or tablet has a minimum dimension of 1.5 mm or less.

10. The composition of claim 1, wherein the composition is in a mouldable or printable form.

11. The composition of claim 10, further comprising an organic binder and a solvent for the binder, said binder being permeable to hydrogen.

12. The composition of claim 11, wherein the binder comprises a cellulose derivative.

13. The composition of claim 11, wherein the binder comprises a polymeric binder.

14. The composition of claim 1, from which a support comprising a third metal oxide or carbon is absent.

15. The composition of claim 1, consisting essentially of:
   i) the first metal oxide;
   ii) the second metal oxide;
   iii) the moisture absorbing material;
   iv) 0-25 wt. % of a binder, relative to the total weight of the composition; and
   v) optionally, materials selected from a colorant and a lubricant;
wherein the first metal oxide is more readily reducible in hydrogen at temperatures between 0° C. and 100° C. than the second metal oxide.

16. An electronic device incorporating the composition of claim 15.

17. An electronic device incorporating the composition of claim 1.

18. A hydrogen getter composition, comprising:
   i) a first metal oxide, comprising an oxide of a metal selected from the group consisting of platinum, palladium, rhodium, and ruthenium;
   ii) 95 to 99.9 wt. % of a second metal oxide, relative to the total metal oxide components of the composition, comprising an oxide of a metal selected from the group consisting of copper, iron, nickel, cobalt, and cerium; and
   iii) a moisture absorbing material;
wherein:
   a) the first metal oxide is supported on the second metal oxide; and
   b) 0.01% to 5 wt. % of the first metal oxide is present, calculated as the metal and based upon the total weight of the first and second metal oxides.

19. The composition of claim 18, wherein the first metal oxide is precipitated onto the second metal oxide.

20. The composition of claim 18, wherein the first metal oxide is impregnated onto the second metal oxide.

21. The composition of claim 18, wherein the moisture absorbing material is present in an amount of 5-75 wt. %, relative to the total weight of the composition.

22. The composition of claim 21, wherein the moisture absorbing material comprises a zeolite.

23. The composition of claim 22, wherein the zeolite is selected from the group consisting of FAU zeolites and LTA zeolites.

24. The composition of claim 18, wherein the composition is in the form of a shaped pellet or tablet.

25. The composition of claim 24, wherein the pellet or tablet has a minimum dimension of 1.5 mm or less.

26. The composition of claim 18, wherein the composition is in a mouldable or printable form.

27. The composition of claim 26, further comprising an organic binder and a solvent for the binder, said binder being permeable to hydrogen.

28. The composition of claim 27, wherein the binder comprises a cellulose derivative.

29. The composition of claim 28, wherein the binder comprises a polymeric binder.

30. The composition of claim 18, from which a support comprising a third metal oxide or carbon is absent.

31. The composition of claim 18, consisting essentially of:
   i) the first metal oxide;
   ii) the second metal oxide;
   iii) the moisture absorbing material;
   iv) 0-25 wt. % of a binder, relative to the total weight of the composition; and
   v) optionally, materials selected from a colorant and a lubricant;
wherein the first metal oxide is more readily reducible in hydrogen at temperatures between 0° C. and 100° C. than the second metal oxide.

32. An electronic device incorporating the composition of claim 31.

33. An electronic device incorporating the composition of claim 18.

* * * * *